US011322402B2

(12) United States Patent
Xie et al.

(10) Patent No.: US 11,322,402 B2
(45) Date of Patent: May 3, 2022

(54) SELF-ALIGNED TOP VIA SCHEME

(71) Applicant: INTERNATIONAL BUSINESS MACHINES CORPORATION, Armonk, NY (US)

(72) Inventors: Ruilong Xie, Niskayuna, NY (US); Chih-Chao Yang, Glenmont, NY (US); Carl Radens, LaGrangeville, NY (US); Juntao Li, Cohoes, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/540,497

(22) Filed: Aug. 14, 2019

(65) Prior Publication Data
US 2021/0050259 A1  Feb. 18, 2021

(51) Int. Cl.
*H01L 21/768* (2006.01)
*H01L 23/522* (2006.01)

(52) U.S. Cl.
CPC .. *H01L 21/76897* (2013.01); *H01L 21/76837* (2013.01); *H01L 21/76849* (2013.01); *H01L 21/76883* (2013.01); *H01L 23/5226* (2013.01)

(58) Field of Classification Search
CPC ......... H01L 21/76897; H01L 21/76837; H01L 23/5226; H01L 21/76849; H01L 21/76877–76883; H01L 21/7684
See application file for complete search history.

(56) References Cited

U.S. PATENT DOCUMENTS

| | | | |
|---|---|---|---|
| 3,647,508 A | 3/1972 | Gorrell | |
| 5,256,274 A | 10/1993 | Poris | |
| 5,368,711 A | 11/1994 | Poris | |
| 5,693,568 A * | 12/1997 | Liu | H01L 21/76897 |
| | | | 438/618 |
| 6,258,709 B1 | 7/2001 | McDaniel | |
| 6,291,891 B1 * | 9/2001 | Higashi | H01L 23/5226 |
| | | | 257/E21.507 |
| 7,205,228 B2 | 4/2007 | Padhi et al. | |
| 8,188,810 B2 | 5/2012 | Fazzio et al. | |
| 8,299,625 B2 | 10/2012 | Ponoth et al. | |
| 9,324,650 B2 | 4/2016 | Edelstein et al. | |
| 9,607,893 B1 | 3/2017 | Zhang et al. | |
| 9,711,366 B2 | 7/2017 | Ingle et al. | |
| 9,793,163 B2 | 10/2017 | Bristol et al. | |
| 9,953,865 B1 | 4/2018 | Briggs et al. | |
| 9,966,337 B1 | 5/2018 | Briggs et al. | |
| 10,177,028 B1 | 1/2019 | LiCausi et al. | |
| 2001/0034125 A1 * | 10/2001 | Uozumi | H01L 21/02074 |
| | | | 438/678 |
| 2009/0206485 A1 * | 8/2009 | Yang | H01L 23/5226 |
| | | | 257/751 |

(Continued)

*Primary Examiner* — Julio J Maldonado
*Assistant Examiner* — Mohammad A Rahman
(74) *Attorney, Agent, or Firm* — Tutunjian & Bitetto, PC; L. Jeffery Kelly

(57) ABSTRACT

A semiconductor device includes a base structure including a lower level via and a lower level dielectric layer, a conductive pillar including an upper level line and an upper level via disposed on the lower level via, and a protective structure disposed between the lower level via and the upper level line. The protective structure includes a material having an etch rate less than or equal to that of the lower level via.

14 Claims, 12 Drawing Sheets

(56) References Cited

U.S. PATENT DOCUMENTS

2018/0040510 A1    2/2018  Briggs et al.
2019/0027406 A1\*  1/2019  Chu .................... H01L 23/5226
2019/0363008 A1\* 11/2019  Gstrein ............... H01L 23/5283

\* cited by examiner

US 11,322,402 B2

SELF-ALIGNED TOP VIA SCHEME

BACKGROUND

The present invention generally relates to semiconductor devices, and more particularly to self-aligned top vias and methods of forming the same.

Patterning processes can include additive and subtractive patterning processes. Additive patterning refers to patterning involving the addition of material to a device (e.g. by selective deposition), while subtractive patterning refers to patterning involving the removal of material from a device (e.g., using an etch process). As metal pitches become smaller and pitch lines become thinner, subtractive patterning schemes can be attractive due to, e.g., a lack of conductive liner requirement, and resistance benefits provided by such schemes.

SUMMARY

In accordance with an embodiment of the present invention, a method for fabricating a semiconductor device is provided. The method includes forming an upper conductive layer on a lower level dielectric layer of a base structure and a protective structure formed on a lower level via of the base structure. The protective structure includes a conductive cap layer on the lower level via. The method further includes forming a conductive pillar including an upper level line from the upper conductive layer using a subtractive patterning process. The protective structure mitigates damage to the lower level via during the subtractive patterning process.

In accordance with another embodiment of the present invention, a method for fabricating a semiconductor device is provided. The method includes forming an upper conductive layer on a lower level dielectric layer of a base structure and a protective structure formed on a lower level via of the base structure. The protective structure includes a set of liners formed on the lower level via and on sidewalls of the lower level dielectric layer. The method further includes forming a conductive pillar including an upper level line from the upper conductive layer using a subtractive patterning process. The protective structure mitigates damage to the lower level via during the subtractive patterning process.

In accordance with yet another embodiment of the present invention, a semiconductor device is provided. The device includes a base structure including a lower level via and a lower level dielectric layer, a conductive pillar including an upper level line and an upper level via disposed on the lower level via, and a protective structure disposed between the lower level via and the upper level line. The protective structure includes a material having an etch rate less than or equal to that of the lower level via.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
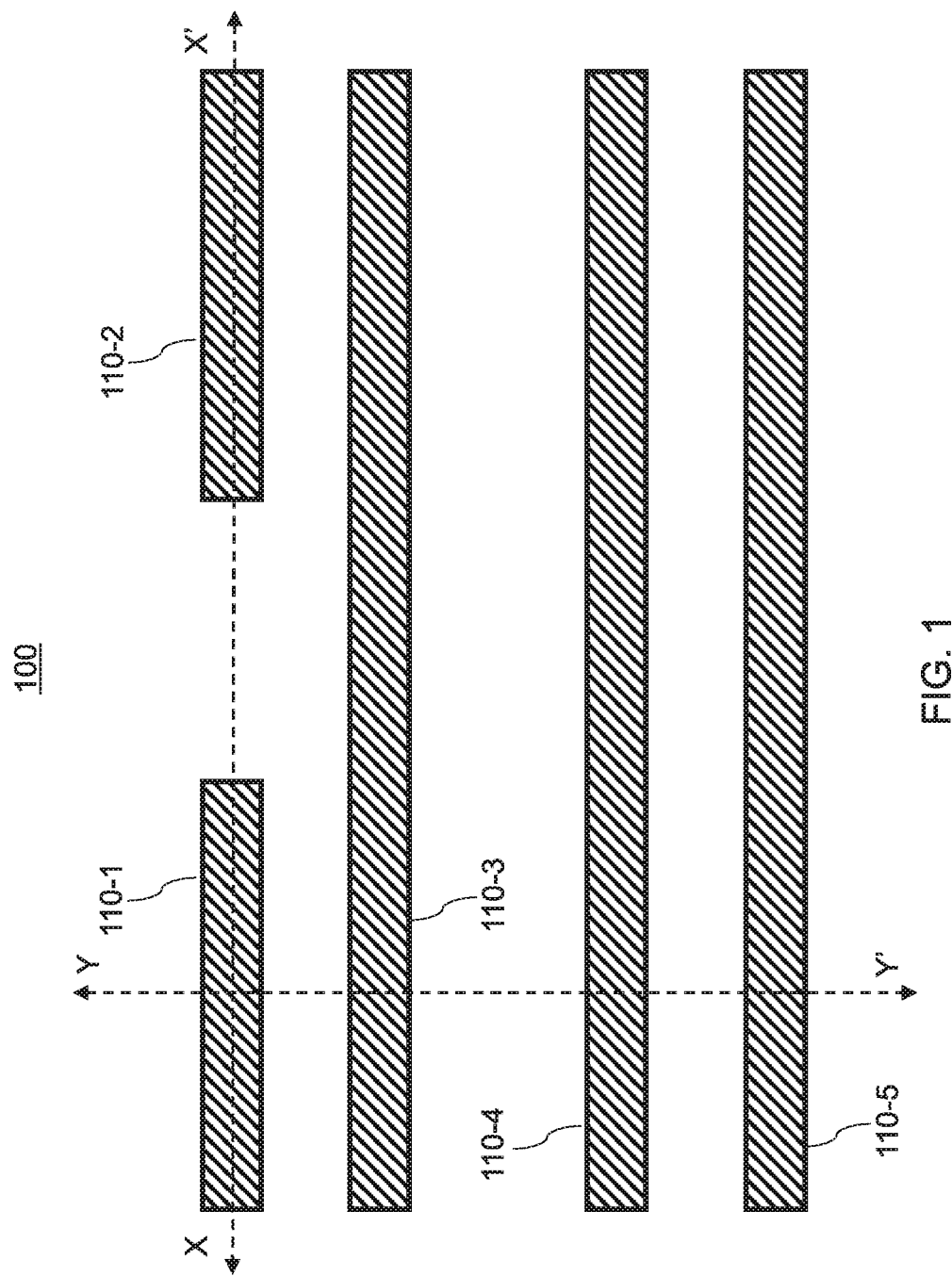
FIG. 1 is a top-down view of an arrangement of conductive lines of a semiconductor device, in accordance with an embodiment of the present invention.

The embodiments described herein provide for a self-aligned subtractive patterning scheme that can prevent or mitigate damage to lower level vias in the event that subtractive patterning used to form upper level lines results in at least one misaligned upper level line. That is, the embodiments described herein can form vias with minimal damage during the subtractive patterning process due to the misalignment issue, and thus can reduce or eliminate resistance and reliability concerns that could have occurred as a result of via damage caused by the misalignment. Accordingly, self-aligned "top vias" can be formed on conductive lines with tight pitch using a subtractive patterning scheme with a relaxed alignment tolerance.

More specifically, material can be formed on surfaces of lower level vias to protect portions of the lower level vias. For example, in one embodiment, cap layers including a first conductive material can be placed between upper level lines and lower level vias including a second conductive material. Here, when a given one of the upper level lines does not fully cover the top surface of a given one of the lower level vias (e.g., a misalignment is present), the given lower level via is substantially overlapped by the corresponding cap layer and the given upper level line, and a portion of the corresponding cap layer covers the given lower level via not overlapped by the given upper level line.

As another example, in another embodiment, sets of liners (e.g., inner spacers) including a first conductive material can placed between upper level lines and lower level vias including a second conductive material. Here, when an upper portion of a given one of the upper level lines does not fully cover the top surface of a given one of the lower level vias (e.g., a misalignment is present), the given lower level vias includes the first and second materials, and the upper portion is substantially overlapped by the top conductive line region.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 2:
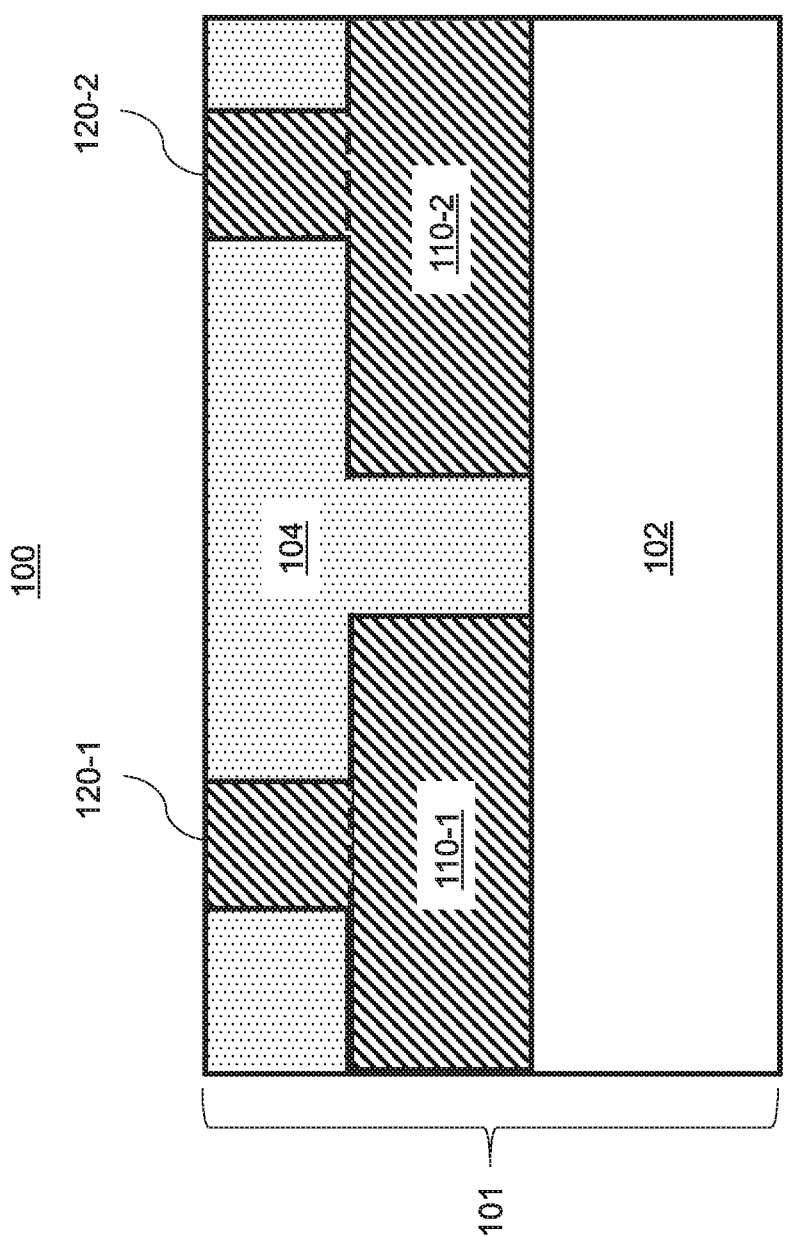
FIG. 2 is a cross-sectional view of the formation a base structure during the fabrication of the semiconductor device, in accordance with an embodiment of the present invention.

Referring now to the drawings in which like numerals represent the same or similar elements and initially to FIG. 1, a top-down view of a portion of a semiconductor device 100 is provided. With reference to FIG. 2, a cross-sectional view of the device 100 through line X-X' of FIG. 1 is provided and, with reference to FIG. 3, a cross-sectional view of the device 100 through line Y-Y' of FIG. 1 is provided.

Figure 3:
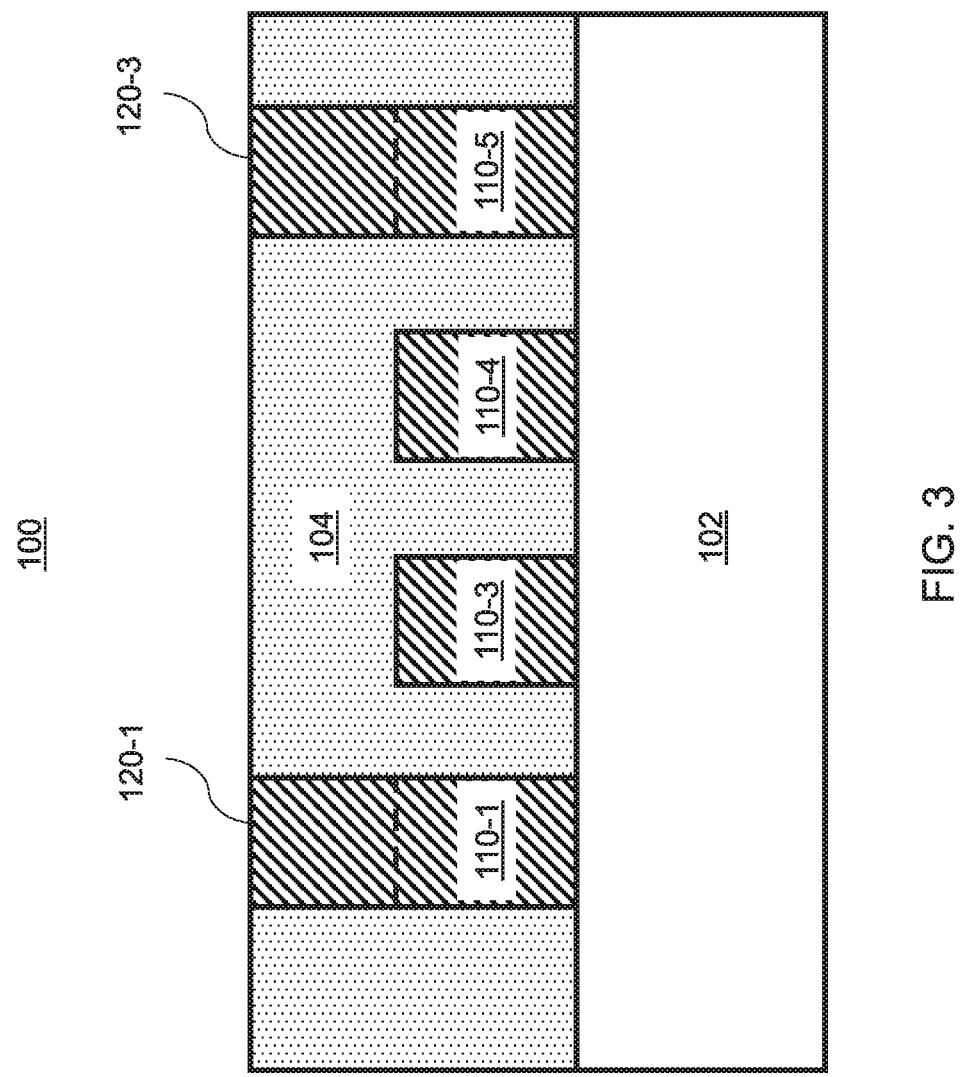
FIG. 3 is another cross-sectional view of the semiconductor device shown in FIG. 2, in accordance with an embodiment of the present invention.

As shown in FIGS. 2-3, the device 100 includes a base structure 101. The base structure 101 includes underlying devices 102. For example, the underlying devices 102 can include underlying transistors with contacts. As another example, the underlying devices 102 can include underlying conductive material levels.

The base structure 101 further includes a lower interlayer dielectric (ILD) layer 104. The lower ILD layer 104 can include any suitable material in accordance with the embodiments described herein. For example, the lower ILD layer 104 can include, e.g., silicon dioxide ($SiO_2$), low-k dielectrics, nitride layers, and combinations thereof. In one embodiment, the lower ILD layer 104 can include an ultra low-k dielectric (ULK) material.

The base structure 101 further includes conductive material formed on the underlying devices 102 and separated by the lower ILD layer 104. In one embodiment, the conductive material includes a metal. More specifically, the conductive material includes lower level lines 110-1 through 110-5, and a plurality of lower level vias, including lower level vias 120-1 through 120-3. As shown, the lower level line 110-1 and the lower level via 120-1 are formed from a first continuous portion of conductive material, the lower level line 110-2 and the lower level via 120-2, and the lower level line 110-5 and the lower level via 120-3 are formed from a second continuous portion of conductive material. Examples of suitable conductive materials that can be used to form the plurality of lower level lines and the plurality of lower level vias include, but are not limited to, copper (Cu), tungsten (W), cobalt (Co), ruthenium (Ru), aluminum (Al), etc.

The base structure 101 can be formed by forming the conductive material on the underlying devices 102, removing portions of the conductive material to form the plurality of lower level lines and the lower level vias (e.g., lower level lines 110-1 through 110-5 and lower level vias 120-1 through 120-3), forming dielectric material on the underlying devices and the conductive material, and planarizing (e.g., using chemical-mechanical planarization (CMP)).

Figure 4:
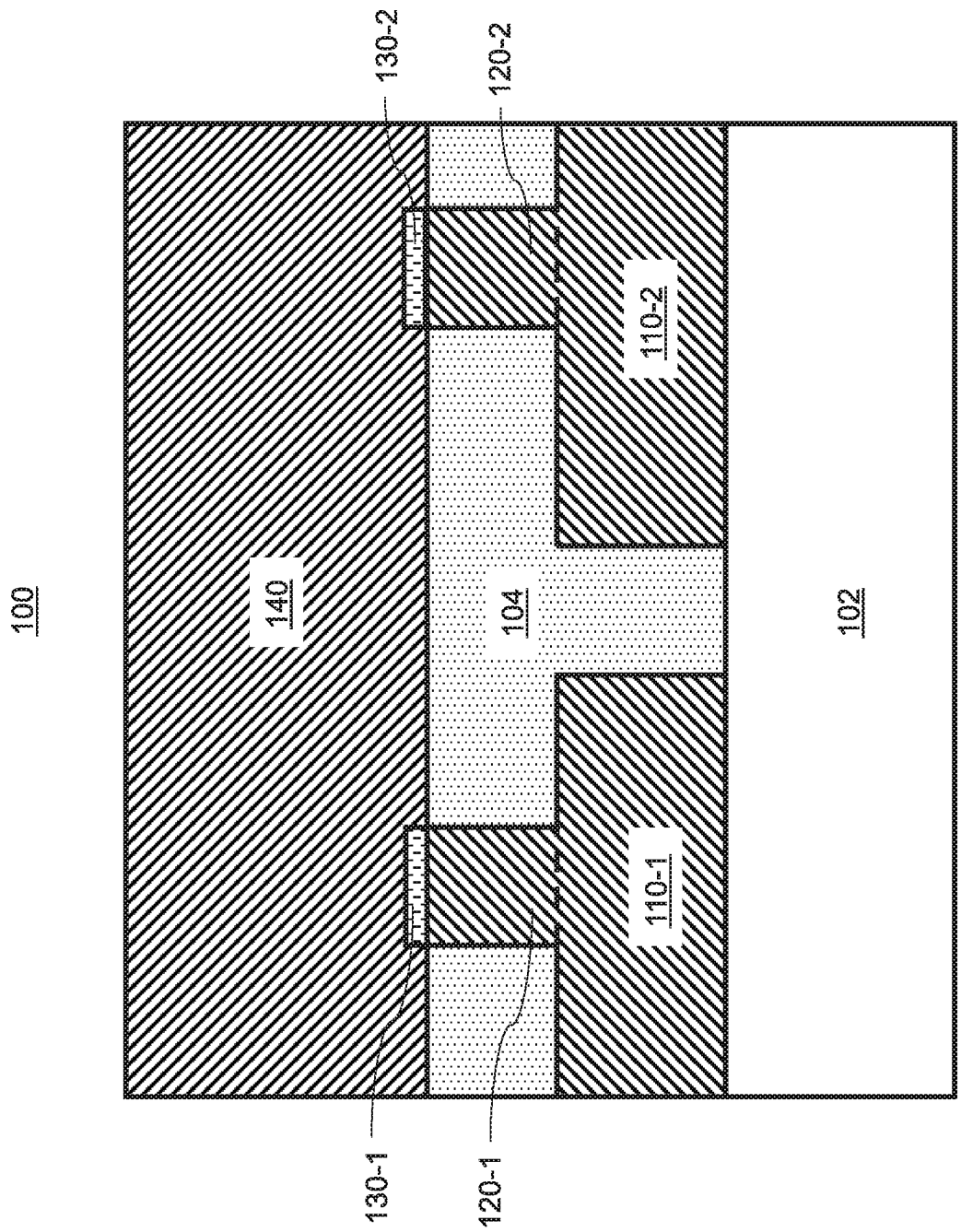
FIG. 4 is a cross-sectional view of the formation of cap layers and an upper conductive layer during the fabrication of the semiconductor device, in accordance with an embodiment of the present invention.

With reference to FIG. 4, a plurality of conductive cap layers including a cap layer 130-1 and a cap layer 130-2 are formed. The cap layer 130-1 is formed on the lower level via 120-1 and the cap layer 130-2 is formed on the lower level via 120-2. The cap layers 130-1 and 130-2 can be formed by performing selective deposition of conductive material on the surfaces of the lower level vias 120-1 and 120-2. The cap layers 130-1 and 130-2 can be thin layers. For example, the cap layers 130-1 and 130-2 can have a thickness ranging from, e.g., about 3 nm to about 10 nm.

As will be described in further detail below, the cap layers 130-1 and 130-2 will function as etch stop layers for the lower level vias 120-1 and 120-2, respectively, during a subsequent subtractive patterning process used to form upper level conductive material. That is, the cap layers 130-1 and 130-2 can include a material having an etch rate less than or equal to that of the lower level vias 120-1 and 120-2. The cap layers 130-1 and 130-2 can include any suitable material in accordance with the embodiments described herein. In one embodiment, the cap layers 130-1 and 130-2 include a low-resistance ("low-R") conductive material. Examples of low-R conductive materials include, but are not limited to, cobalt (Co), tungsten (W), cobalt tungsten phosphide (CoWP), etc.

In an alternative embodiment, the lower level vias 120-1 and 120-2 can be recessed prior to the formation of the cap layers 130-1 and 130-2. In this embodiment, the cap layers 130-1 and 130-2 can be formed to have top surfaces coplanar with the top surface of the lower ILD layer 104.

As further shown in FIG. 4, an upper conductive layer 140 is formed on the lower ILD layer 104 and the cap layers 130-1 and 130-2. For example, the upper conductive layer 140 can be deposited. The upper conductive layer 140 corresponds to the upper level of the device 100 and, as will be described in further detail herein, can be processed to form upper level lines and upper level vias. In one embodiment, the upper conductive layer 140 includes a metal. Examples of suitable conductive materials that can be used to form the upper conductive layer 140 include, but are not limited to, copper (Cu), tungsten (W), cobalt (Co), ruthenium (Ru), aluminum (Al), etc.

Figure 5:
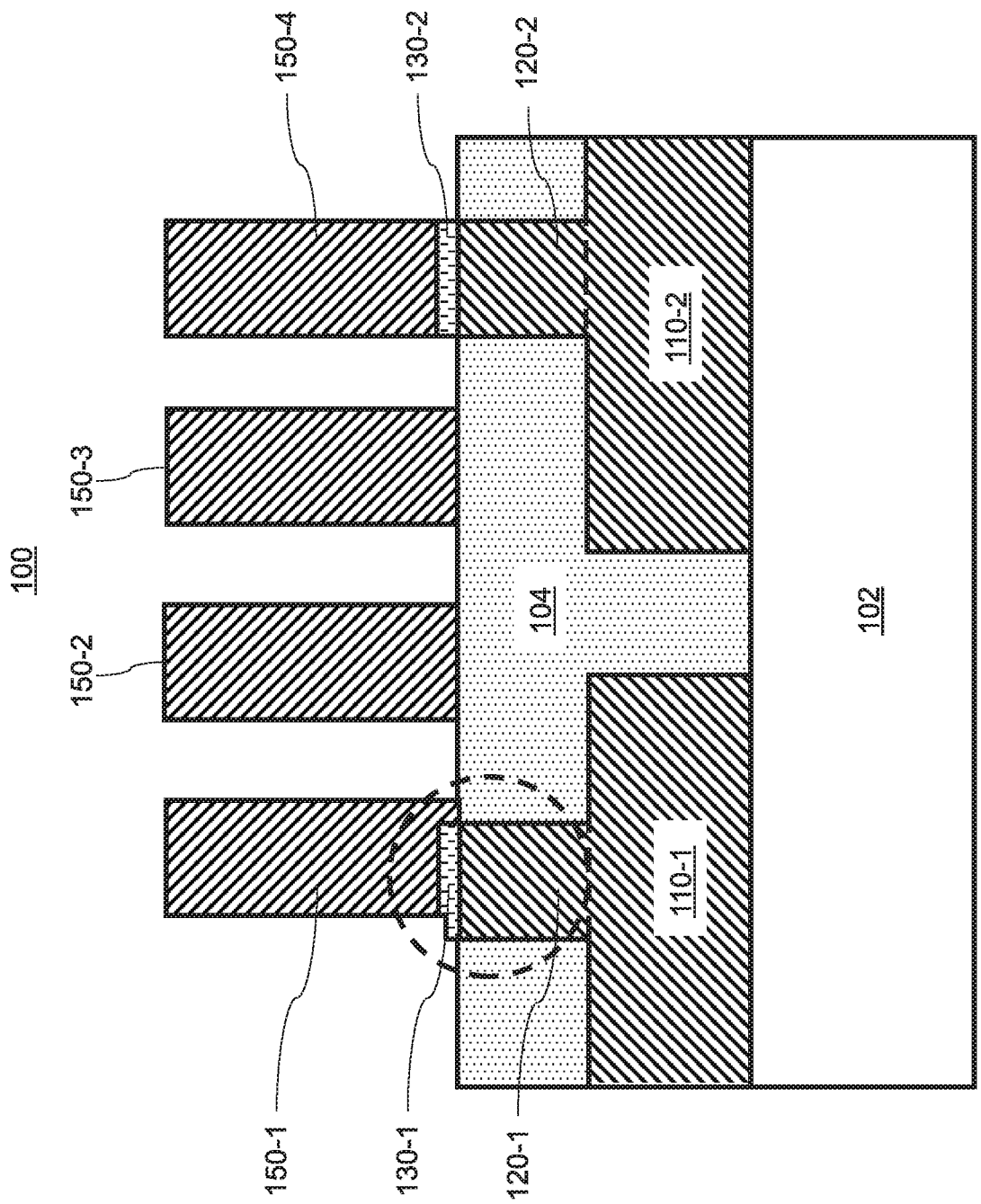
FIG. 5 is a cross-sectional view of the formation of conductive pillars from the upper conductive layer during the fabrication of the semiconductor device, in accordance with an embodiment of the present invention.

With reference to FIG. 5, the upper conductive layer 140 is etched to form conductive pillars 150-1 through 150-4. Any suitable etch process can be used to form the conductive pillars 150-1 through 150-4 from the upper conductive layer 140 in accordance with the embodiments described herein. For example, a subtractive etch line patterning process can be used to form the conductive pillars 150-1 through 150-4.

As can be seen in the illustrative embodiment of FIG. 5, the processing of the upper conductive layer 140 has resulted in the conductive pillar 150-4 being well-aligned in that the conductive pillar 150-4 is formed substantially entirely over the cap layer 130-2 and in line with the lower level via 120-2. Furthermore, as noted by the dashed line circle in FIG. 5, the processing of the upper conductive layer 140 has resulted in the conductive pillar 150-1 being misaligned with respect to the lower level via 120-1. More specifically, the processing of the upper conductive layer 140 has removed material in a manner such that a portion of the conductive pillar 150-1 remains on the lower ILD layer 104. However, as mentioned above with reference to FIG. 2, the cap layer 130-1 is formed from a material having an etch rate less than or equal to that of the material used to form the lower level via 120-1. This mitigates or prevents damage to the lower level via 120-1.

Figure 6:
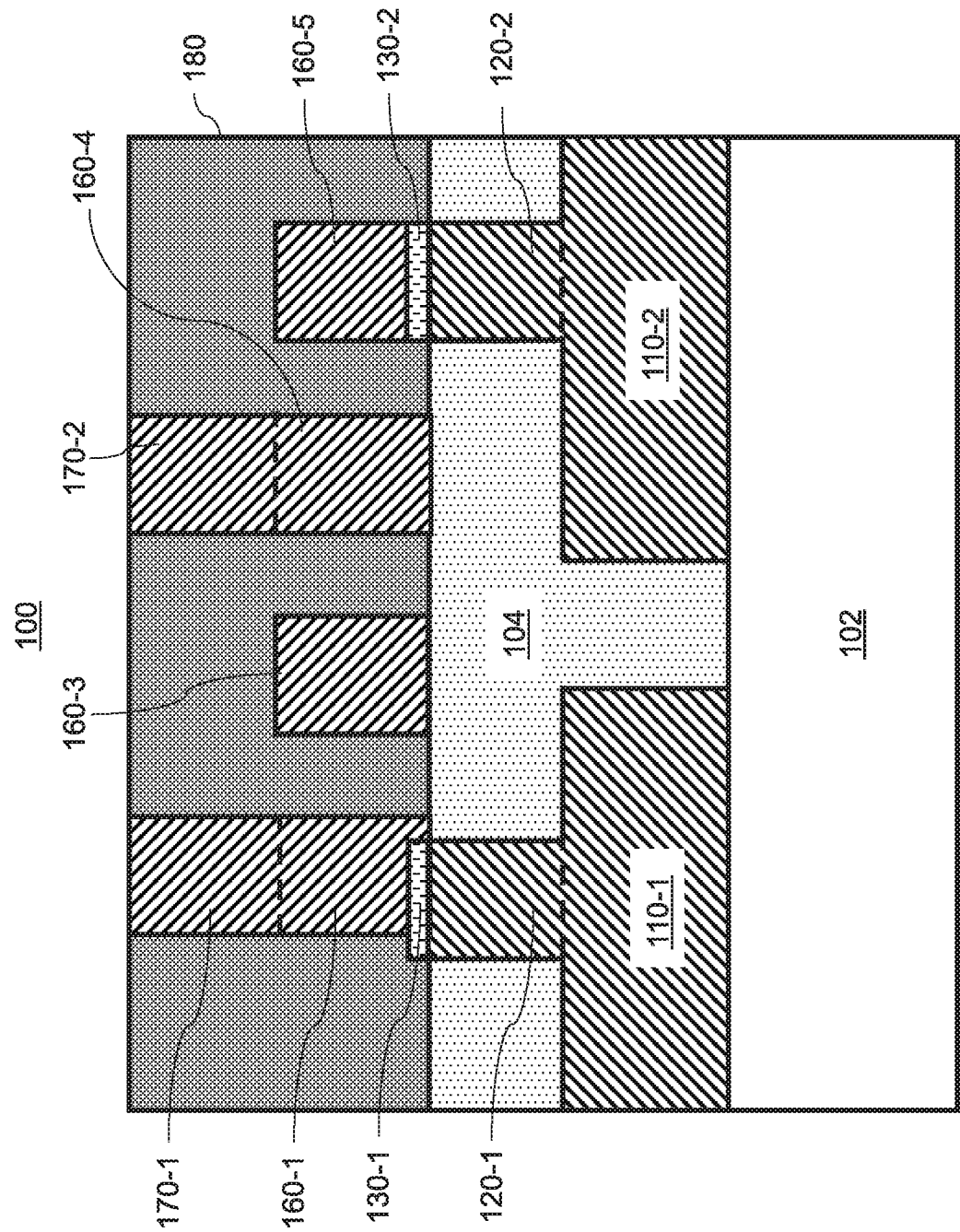
FIG. 6 is a cross-sectional view of the formation of upper level conductive lines and vias from the conductive pillars during the fabrication of the semiconductor device, in accordance with an embodiment of the present invention.
Figure 7:
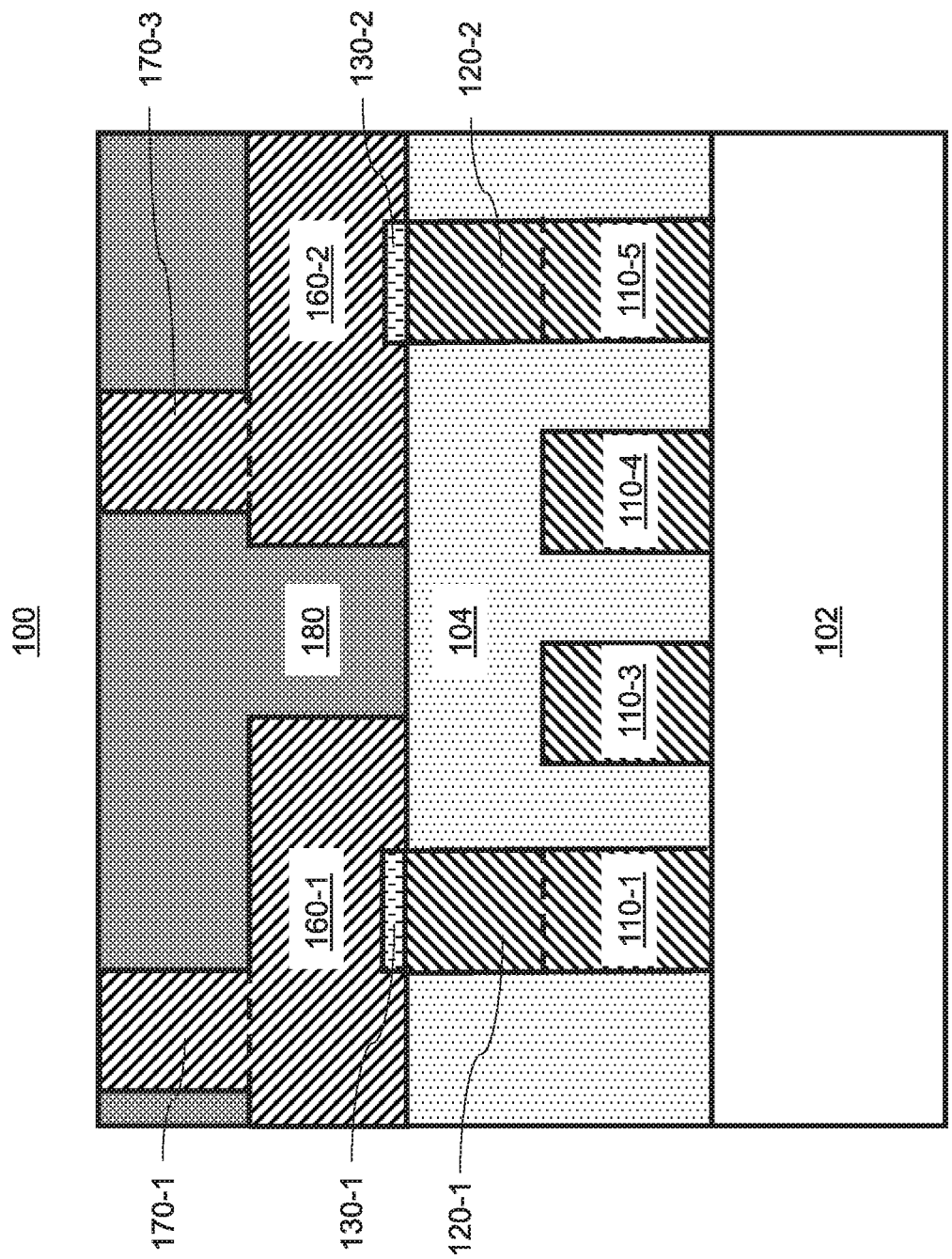
FIG. 7 is another cross-sectional view of the device shown in FIG. 6.
Figure 8:
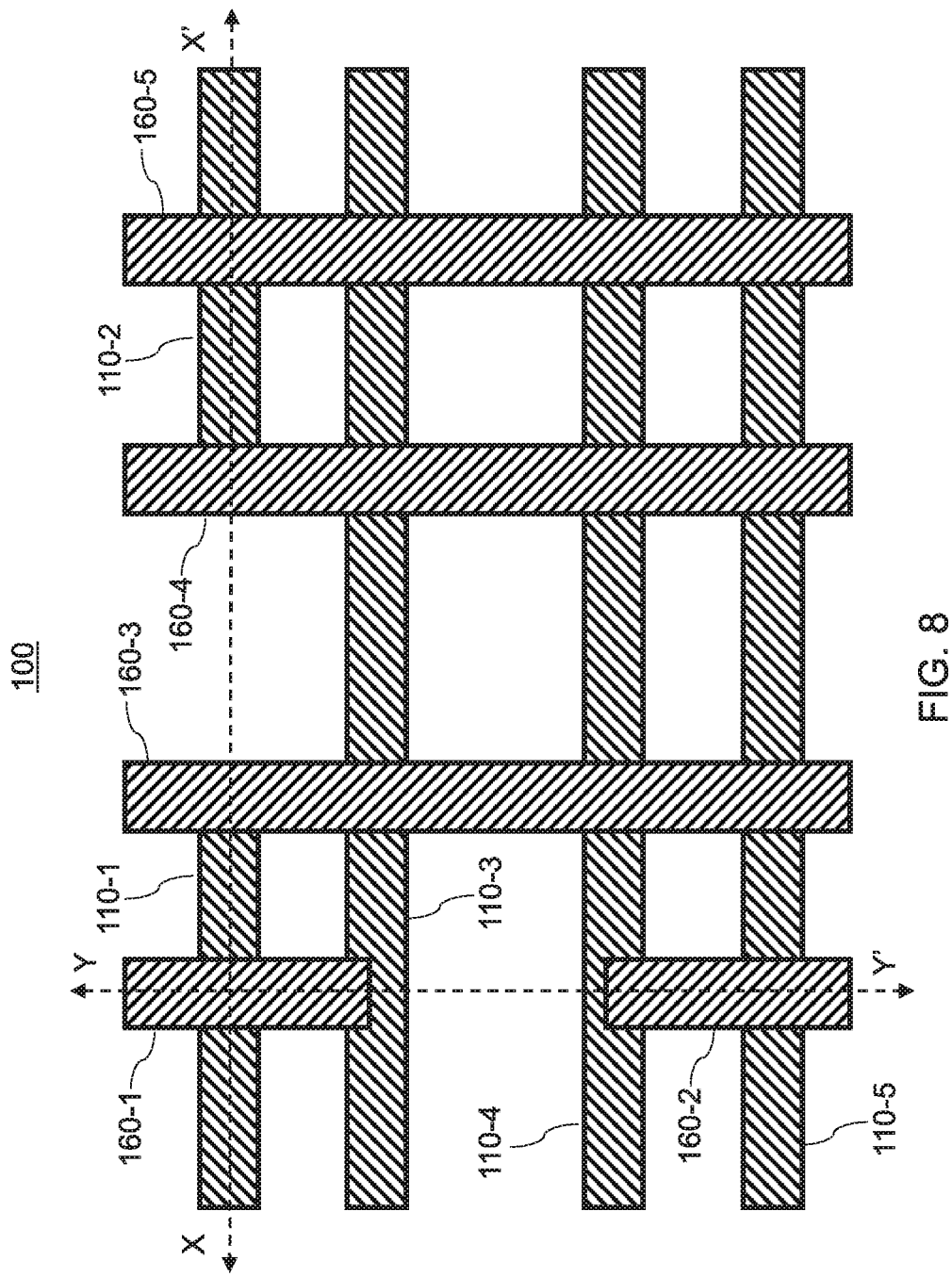
FIG. 8 is a top-down view of the device shown in FIGS. 6 and 7.

With reference to FIGS. 6 and 7, cross-sectional views are provided showing processing performed on the conductive pillars 150-1 through 150-4 to form upper level conductive lines 160-1 through 160-5 and upper level vias 170-2 through 170-3, and with reference to FIG. 8, a top-down view is provided showing an illustrative arrangement of the lower level conductive lines 110-1 through 110-5 and the upper level conductive lines 160-1 through 160-5. FIG. 6 corresponds to a cross-sectional view of the device 100 through line X-X' of FIG. 8, and FIG. 7 corresponds to a cross-sectional view of the device 100 through line Y-Y' of FIG. 8.

As shown in FIGS. 6 and 7, upper level via 170-1 is formed on the upper level conductive line 160-1, the upper level via 170-2 is formed on the upper level conductive line 160-3, and the upper level via 170-3 is formed on the upper level conductive line 160-2. The upper level vias 170-1 through 170-3 can be formed through subtractive metal patterning by recessing the original metal pillars from regions where there are no vias.

As further shown in FIGS. 6 and 7, an upper ILD layer 180 is formed. The upper ILD layer 180 can include any suitable material in accordance with the embodiments described herein. For example, the upper ILD layer 180 can include, e.g., silicon dioxide ($SiO_2$), low-k dielectrics, nitride layers, and combinations thereof. In one embodiment, the upper ILD layer 180 can include a ULK material. In one embodiment, the upper ILD layer 180 includes the same material as the lower ILD layer 104. In another embodiment, the upper ILD layer 180 includes a different material from the lower ILD layer 104.

FIGS. 1-8 have illustrated one embodiment of a self-aligned via top via scheme in which cap layers are selectively formed on lower level vias to protect the lower level vias during formation of upper level conductive material including upper level lines and upper level vias. A second embodiment of a self-aligned via scheme in which liners (e.g., inner spacers) are formed instead of cap layers will now be described herein below with reference to FIGS. 7-9.

Figure 9:
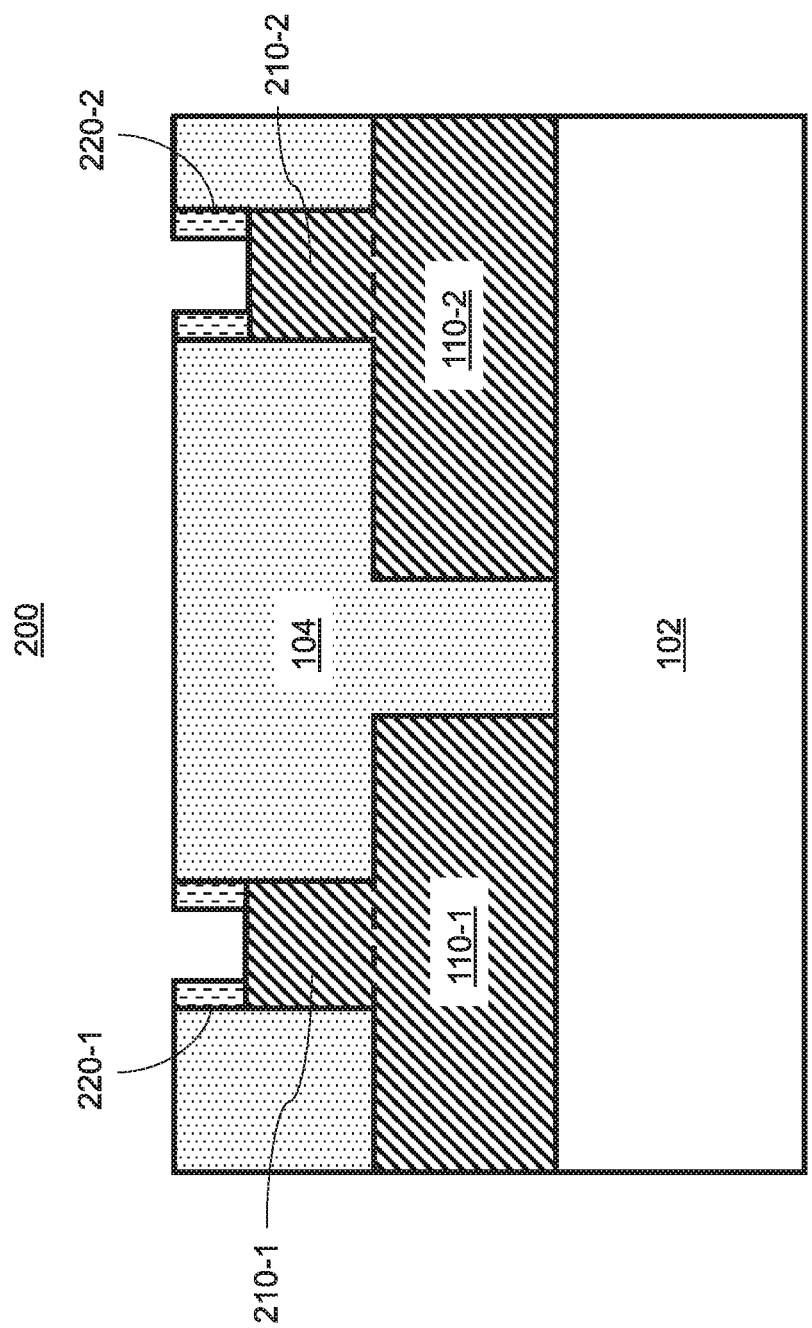
FIG. 9 is a cross-sectional view of the formation of sets of liners from the base structure during the fabrication of the semiconductor device, in accordance with another embodiment of the present invention.

With reference to FIG. 9, a semiconductor device 200 is shown. It is assumed that the processing of the device 200 begins from the base structure 101 including underlying devices 102, lower ILD layer 104, lower level lines 110-1 and 110-2 and lower level vias 120-1 and 120-2, as described above with reference to FIGS. 1-3.

As shown, the lower level vias 120-1 and 120-2 of FIG. 1 are recessed to form recessed vias 210-1 and 210-2, respectfully. The recessing provides for a surface topography for the formation of sets of liners 220-1 and 220-2 (e.g., inner spacers) on the recessed vias 210-2 and 210-2, respectively, and on the sidewalls of the lower ILD layer. In one embodiment, the sets of liners 220-1 and 220-2 are formed using conformal deposition and etching. For example, the sets of liners 220-1 and 220-2 can be formed by depositing liner material using atomic layer deposition (ALD) and using directional reactive-ion etching (RIE) to remove portions of the liner material to form the sets of liners 220-1 and 220-2.

As will be described in further detail below with reference to FIG. 10, the sets of liners 220-1 and 220-2 function as etch stop layers for the lower level vias 210-1 and 210-2, respectively, during a subsequent subtractive patterning process used to form upper level conductive material. For example, the sets of liners 220-1 and 220-2 can include a material having an etch rate less than or equal to that of the lower level vias 210-1 and 210-2. The sets of liners 220-1 and 220-2 can include any suitable material in accordance with the embodiments described herein. Examples of suitable materials that can be used to form the sets of the liners 220-1 and 220-2 include, but are not limited to, cobalt (Co), molybdenum (Mo), titanium nitride (TiN), titanium (Ti), tungsten (W), etc.

Figure 10:
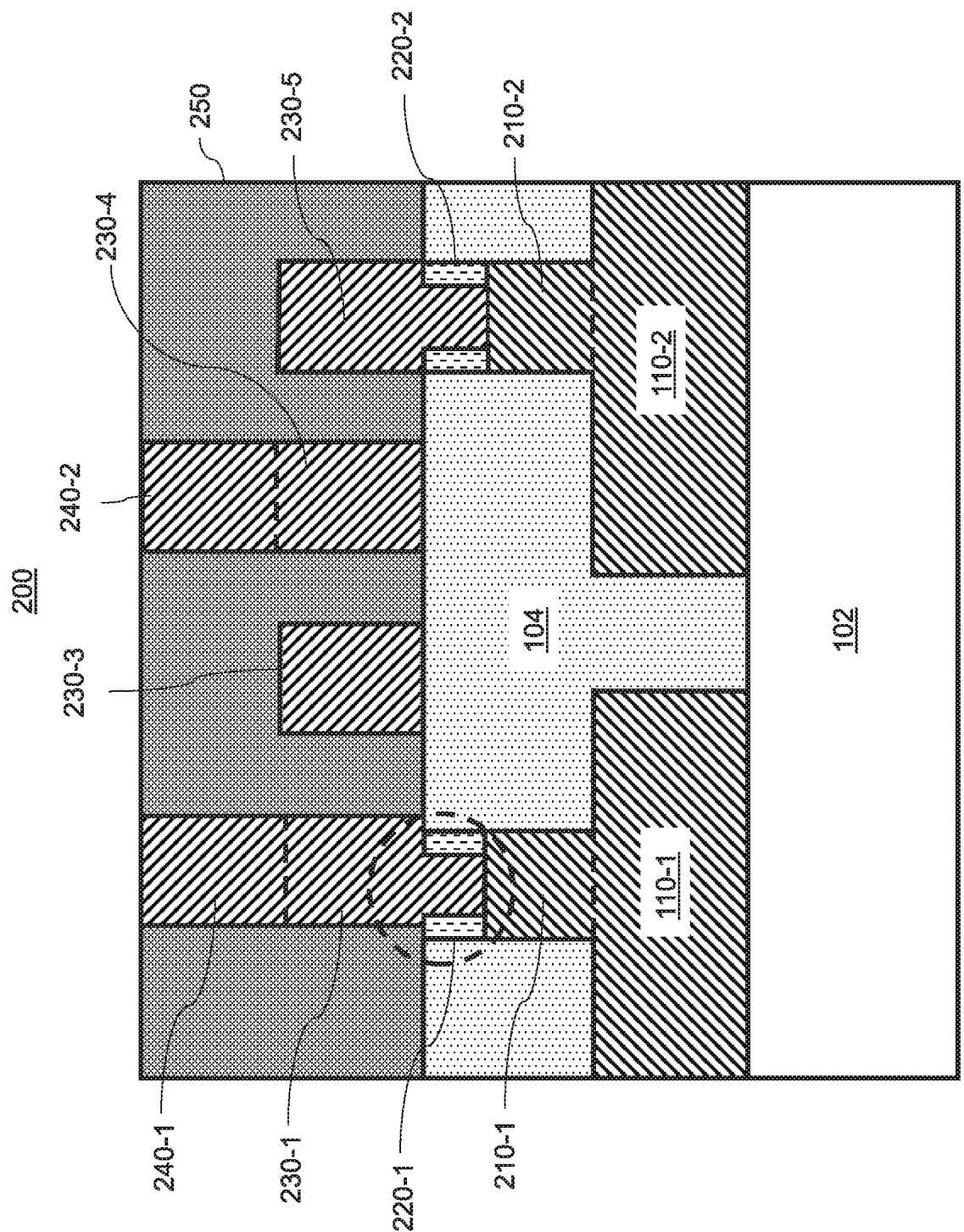
FIG. 10 is a cross-sectional view of the formation of upper conductive lines, upper conductive vias and an upper dielectric layer during the fabrication of the semiconductor device, in accordance with another embodiment of the present invention.
Figure 11:
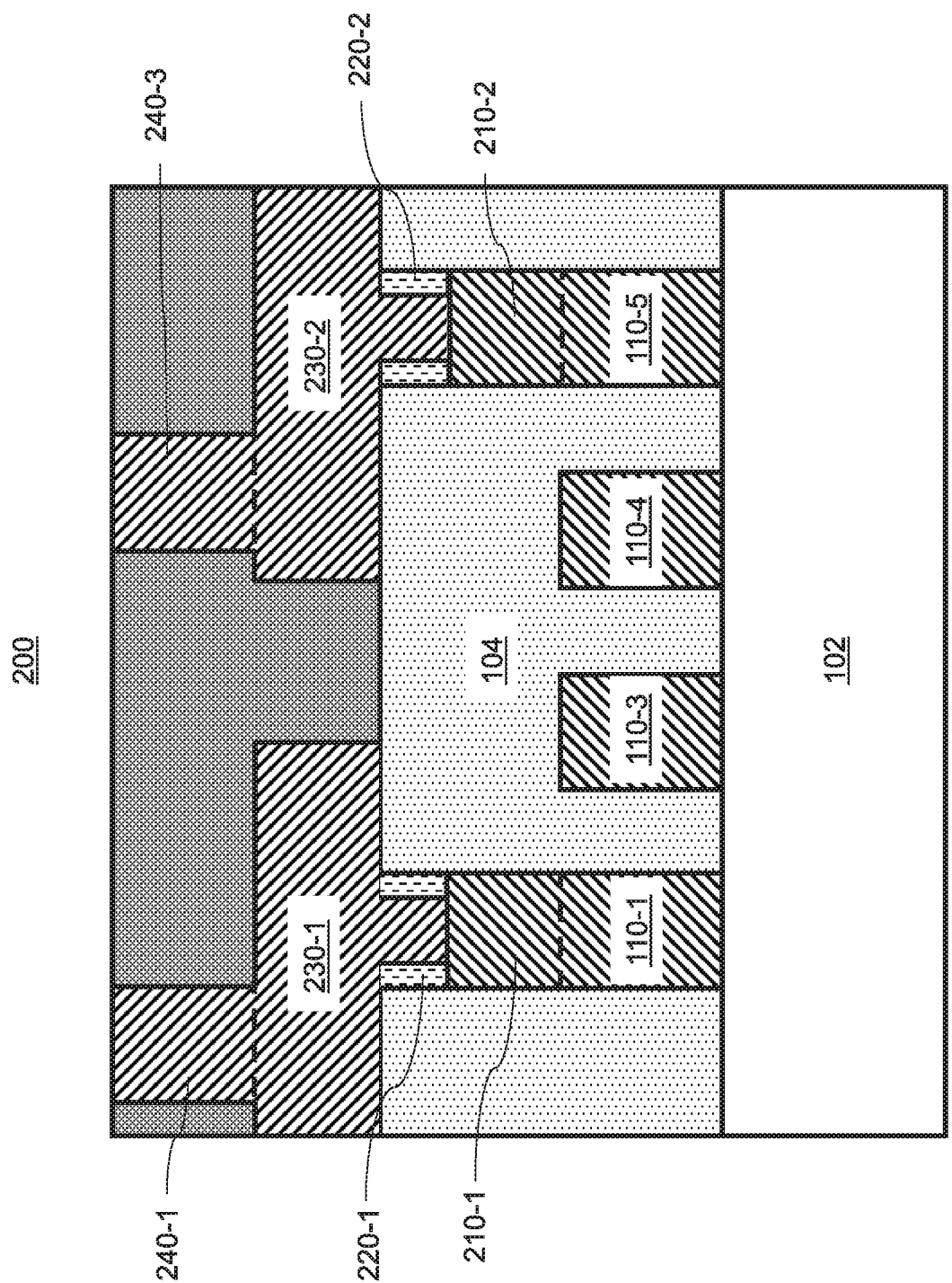
FIG. 11 is another cross-sectional view of the device shown in FIG. 10.

With reference to FIGS. 10 and 11, further processing similar to that described above with reference to FIGS. 4-8 is performed to form upper level lines 230-1 through 230-5, upper level vias 240-1 through 240-3 and an upper ILD layer 250. The upper level via 240-1 is formed on the upper level line 230-1, the upper level via 240-2 on the upper level line 230-4, the upper level via 240-3 is formed on the upper level line 230-2. The upper level lines 230-1 through 230-5 can include a same or similar material to that of the upper level lines 160-1 through 160-5 of FIG. 5, the upper level vias 240-1 through 240-3 can include a same or similar material to that of the upper level vias 170-3 and 170-3 of FIG. 5, and the upper ILD layer 250 can include a similar or similar material to that of the upper ILD layer 180 of FIG. 5.

As can be seen in the illustrative embodiment of FIG. 10, the upper level line 230-5 is well-aligned in that the upper level line 230-5 is formed substantially entirely over the set of liners 220-2 and in line with the lower level via 210-2.

Furthermore, as noted by the dashed line circle in FIG. 8, the upper level line 230-1 is misaligned with respect to the lower level via 210-1. More specifically, the processing of the conductive material to form the upper level line 230-1 has removed material in a manner such that a portion of the upper level line 230-1 remains on the lower ILD layer 104. However, the set of liners 220-1 mitigates or prevent damages to the lower level via 210-1.

Figure 12:
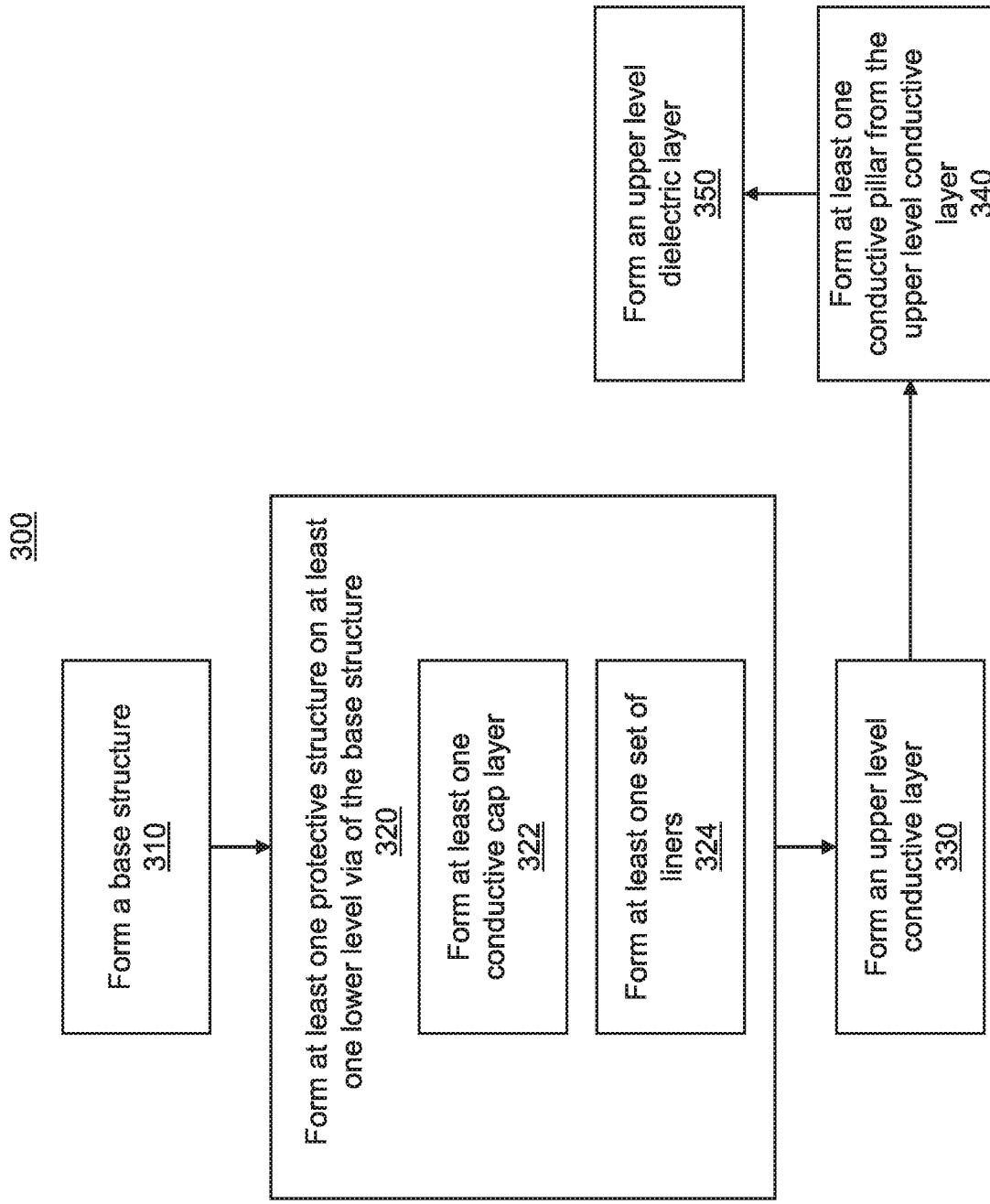
FIG. 12 is a block/flow diagram illustrating a system/method for fabricating a semiconductor device, in accordance with an embodiment of the present invention.

With reference to FIG. 12, a block/flow diagram is provided illustrating a system/method 300 for fabricating a semiconductor device.

At block 310, a base structure is formed. Forming the base structure can include forming underlying devices, forming a lower level dielectric layer (e.g., ILD) on the underlying devices, and forming conductive material separating the conductive material on the underlying devices.

The underlying devices can include underlying transistors with contacts. As another example, the underlying device can include underlying conductive material levels.

The lower level dielectric layer can include any suitable material in accordance with the embodiments described herein. For example, the lower level dielectric layer can include, e.g., silicon dioxide ($SiO_2$), low-k dielectrics, nitride layers, and combinations thereof. In one embodiment, the lower level dielectric layer can include a ULK material.

In one embodiment, the conductive material includes a metal. More specifically, the conductive material can include at least one lower level line and at least one lower level via formed from a continuous portion of conductive material. Examples of suitable conductive materials that can be used to form the plurality of lower level lines and the plurality of lower level vias include, but are not limited to, copper (Cu), tungsten (W), cobalt (Co), ruthenium (Ru), aluminum (Al), etc.

The base structure can be formed by forming the conductive material on the underlying devices, removing portions of the conductive material to form the at least one lower level line and the at least one lower level vias, forming dielectric material on the underlying devices and the conductive material, and planarizing (e.g., using chemical-mechanical planarization (CMP)).

At block 320, at least one protective structure is formed on the at least one lower level via of the base structure. The at least one protective structure is formed to mitigate damage to the at least one lower level via during a subsequent patterning process used to form upper level conductive material.

In one embodiment, forming the at least one protective structure can include, at block 322, forming at least one conductive cap layer. The at least one conductive cap layer can be formed on the at least one lower level via. The at least one conductive cap layer can be formed by performing selective deposition of conductive material on the surface of the at least one lower level via. The at least one conductive cap layer can be formed as a thin layer. For example, the at least one conductive cap layer can be formed having a thickness ranging from, e.g., about 3 nm to about 10 nm.

The at least one conductive cap layer will function as etch stop layer for the at least one lower level via during the subsequent subtractive patterning process. That is, the at least one conductive cap layer can include a material having an etch rate less than or equal to that of the at least one lower level via. The at least one conductive cap layer can include any suitable material in accordance with the embodiments described herein. In one embodiment, the at least one conductive cap layer includes a low-R conductive material.

Examples of low-R conductive materials include, but are not limited to, cobalt (Co), tungsten (W), cobalt tungsten phosphide (CoWP), etc.

In an alternative embodiment, the at least one lower level via can be recessed prior to the formation of the at least one conductive cap layer. In this embodiment, the at least one conductive cap layer can be formed to have a top surface coplanar with the top surface of the lower ILD layer.

Further details regarding block 322 are described above with reference to FIGS. 4 and 5.

In another embodiment, forming the at least one protective structure can include, at block 324, forming at least one set of liners. For example, forming the at least one set of liners can include recessing the at least one lower level via to form at least one recessed via, and forming at least one set of liners on the at least one recessed via. The recessing provides for a surface topography for the formation of the at least one set of liners. In one embodiment, the at least one set of liners (e.g., inner spacers) are formed using conformal deposition and etching. For example, the at least one set of liners can be formed by depositing liner material using atomic layer deposition (ALD) and using directional reactive-ion etching (RIE) to remove portions of the liner material to form the at least one set of liners.

The at least one set of liners functions as etch stop layers for the at least one lower level via during the subsequent subtractive patterning process. For example, the at least one set of liners can include a material having an etch rate less than or equal to that of the at least one lower level via. The at least one set of liners can be formed to include any suitable material in accordance with the embodiments described herein. Examples of suitable materials that can be used to form the at least one set of the liners include, but are not limited to, cobalt (Co), molybdenum (Mo), titanium nitride (TiN), titanium (Ti), tungsten (W), etc.

Further details regarding block 324 are described above with reference to FIG. 9.

At block 330, an upper level conductive layer is formed. The upper conductive layer can be formed on the base structure and the at least one protective structure. For example, in the embodiment in which the at least one protective structure includes at least one conductive cap layer, the upper level conductive layer can be formed on the lower level dielectric layer and the at least one protective structure. As another example, in the embodiment in which the at least one protective structure includes at least one set of liners, the upper level conductive layer can be formed on the lower level dielectric layer, the at least one protective structure, and the at least one lower level via.

At block 340, at least one conductive pillar is formed from the upper level conductive layer. More specifically, the at least one conductive pillar can be formed by etching the upper level conductive layer using a subtractive patterning process. For example, the subtractive patterning process can be a subtractive etch line patterning process. The at least one conductive pillar corresponds to the at least one lower level via. The at least one conductive pillar includes an upper level conductive line and an upper level via formed on the upper level conductive line. Any suitable process can be used to form the at least one conductive pillar from the upper level conductive layer in accordance with the embodiments described herein.

In the embodiment in which the at least one protective structure includes at least one conductive cap layer, in one scenario, the processing of the upper level conductive layer can result in the at least one conductive pillar being well-aligned in that the at least one conductive pillar is formed substantially entirely over the at least one conductive cap layer and in line with the at least one lower level via.

In another scenario, the processing of the upper level conductive layer can result in the at least one conductive pillar being misaligned with respect to the at least one lower level via. More specifically, the processing of the upper level conductive layer can remove material in a manner such that a portion of the at least one conductive pillar remains on the lower ILD layer. However, as mentioned above, the at least one conductive cap layer is formed from a material having an etch rate less than or equal to that of the material used to form the at least one lower level via. This mitigates or prevents damage to the at least one lower level via.

In the embodiment in which the at least one protective structure includes at least one set of liners, in one scenario, the processing of the upper level conductive layer can result in the at least one conductive pillar being well-aligned in that the at least one conductive pillar is formed substantially entirely over the at least one set of liners and in line with the at least one lower level via.

In another scenario, the processing of the upper level conductive layer can result in the at least one conductive pillar being misaligned with respect to the at least one lower level via. More specifically, the processing of the upper level conductive layer to form the at least one conductive pillar has removed material in a manner such that a portion of the at least one conductive pillar remains on the lower level dielectric layer. However, the at least one set of liners mitigates or prevent damage to the at least one lower level via.

At block 350, an upper level dielectric layer is formed. The upper level dielectric layer (e.g., ILD) can include any suitable material in accordance with the embodiments described herein. For example, the upper level dielectric layer can include, e.g., silicon dioxide ($SiO_2$), low-k dielectrics, nitride layers, and combinations thereof. In one embodiment, the upper ILD layer can include a ULK material. In one embodiment, the upper ILD layer includes the same material as the lower level dielectric layer. In another embodiment, the upper level dielectric layer includes a different material from the lower level dielectric layer.

Further details regarding blocks 310-350 are described above with reference to FIGS. 1-11.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:

forming an upper conductive layer on a lower level dielectric layer of a base structure and a protective structure formed on a lower level via of the base structure, wherein the lower lever via is recessed before forming the protective structure, the protective structure including a liner on a top surface of the lower level via and on sidewalk of the lower level dielectric layer; and forming a conductive pillar including an upper level line and an upper level via on the upper level line, wherein the upper level via is laterally offset from the lower level via, the upper level line formed from the upper conductive layer using a subtractive patterning process, wherein the protective structure mitigates damage to the lower level via during the subtractive patterning process when the conductive pillar is misaligned with the lower level via.

2. The method of claim 1, further comprising forming the protective structure on the lower level via.

3. The method of claim 2, wherein the liner is made of a material having an etch rate less than or equal to the etch rate of the lower level via.

4. The method of claim 3, wherein the liner includes a low-R conductive material.

5. The method of claim 1, wherein the liner has a top surface coplanar with a top surface of the lower level dielectric layer.

6. The method of claim 1, further comprising forming an upper level dielectric layer on the upper level line and the upper level via.

7. A method for fabricating a semiconductor device, comprising:
forming an upper conductive layer on a lower level dielectric layer of a base structure and a protective structure on a lower level via and a lower level line of the base structure, the protective structure including a set of liners formed directly on a top surface of the lower level via and directly on sidewalls of the lower level dielectric layer; and
forming a conductive pillar including an upper level line and an upper level via on the upper level line, wherein the upper level via is laterally offset from the lower level via, the upper level line formed from the upper conductive layer using a subtractive patterning process, wherein the protective structure mitigates damage to the lower level via during the subtractive patterning process when the conductive pillar is misaligned with the lower level via.

8. The method of claim 7, further comprising forming the protective structure on the lower level via.

9. The method of claim 8, wherein forming the protective structure further includes recessing the lower level via to form a recessed via providing surface topography for the formation of the set of liners, and forming the set of liners on the recessed via.

10. The method of claim 8, wherein forming the protective structure further includes depositing liner material using atomic layer deposition (ALD), and using directional reactive-ion etching (RIE) to remove portions of the liner material to form the set of liners.

11. The method of claim 8, wherein the set of liners is formed including a material having an etch rate less than or equal to that of the lower level via.

12. The method of claim 11, wherein the set of liners includes a low-R conductive material.

13. The method of claim 7, wherein forming the conductive pillar further includes forming the upper level via on the upper level line.

14. The method of claim 7, further comprising forming an upper level dielectric layer.

* * * * *